(12) United States Patent
Kato

(10) Patent No.: US 11,915,993 B2
(45) Date of Patent: Feb. 27, 2024

(54) TWO-PACK CURABLE COMPOSITION SET, THERMALLY CONDUCTIVE CURED PRODUCT, AND ELECTRONIC DEVICE

(71) Applicant: Denka Company Limited, Tokyo (JP)

(72) Inventor: Masahiro Kato, Gunma (JP)

(73) Assignee: Denka Company Limited, Tokyo (JP)

( * ) Notice: Subject to any disclaimer, the term of this patent is extended or adjusted under 35 U.S.C. 154(b) by 489 days.

(21) Appl. No.: 17/285,441

(22) PCT Filed: Oct. 10, 2019

(86) PCT No.: PCT/JP2019/040087
§ 371 (c)(1),
(2) Date: Sep. 15, 2021

(87) PCT Pub. No.: WO2020/080256
PCT Pub. Date: Apr. 23, 2020

(65) Prior Publication Data
US 2021/0407885 A1 Dec. 30, 2021

(30) Foreign Application Priority Data
Oct. 15, 2018 (JP) .................. 2018-194637

(51) Int. Cl.
*F23L 15/02* (2006.01)
*F28D 17/00* (2006.01)
(Continued)

(52) U.S. Cl.
CPC ............ *H01L 23/3737* (2013.01); *C08K 3/36* (2013.01); *C08L 83/04* (2013.01); *C08K 2201/001* (2013.01)

(58) Field of Classification Search
CPC . H01L 23/3737; C08K 3/36; C08K 2201/001; C08L 83/04
(Continued)

(56) References Cited

U.S. PATENT DOCUMENTS 10,604,612 B2 3/2020 Fujisawa et al.
2011/0188213 A1 8/2011 Domae et al.

FOREIGN PATENT DOCUMENTS

CN 106221666 A 12/2016
CN 107207859 A 9/2017
(Continued)

OTHER PUBLICATIONS

Silicones, Encyclopedia of Polymer Science and Technology, Wiley, US, Apr. 15, 2003, 765-841.

*Primary Examiner* — Davis D Hwu
(74) *Attorney, Agent, or Firm* — Foley & Lardner LLP

(57) ABSTRACT

A two-pack curable composition set having: a first agent comprising an organopolysiloxane having a branched structure and having a vinyl group at least at an end or in a side chain, a thermally conductive filler, a silica powder, and a platinum catalyst, and having a viscosity at 25° C. at a shear rate of 10 s$^{-1}$ of 20 to 150 Pa·s; and a second agent comprising an organopolysiloxane having a branched structure and having a vinyl group at least at an end or in a side chain, and a polydimethylsiloxane having a hydrosilyl group at least at an end or in a side chain, a thermally conductive filler, and a silica powder, and having a viscosity at 25° C. at a shear rate of 10 s$^{-1}$ of 20 to 150 Pa·s.

5 Claims, 2 Drawing Sheets

(51) Int. Cl.
　　　*H01L 23/373*　　　(2006.01)
　　　*C08K 3/36*　　　(2006.01)
　　　*C08L 83/04*　　　(2006.01)
(58) Field of Classification Search
　　　USPC .......................................................... 165/4
　　　See application file for complete search history.

(56)　　　　　　　References Cited

FOREIGN PATENT DOCUMENTS

| DE | 29716871 U1 | * | 1/1999 |
|---|---|---|---|
| JP | 3915885 B2 | * | 5/2007 |
| JP | 2009-286855 A | | 12/2009 |
| JP | 2010-150399 A | | 7/2010 |
| JP | 2014-105283 A | | 6/2014 |
| JP | 2015-140395 A | | 8/2015 |

\* cited by examiner

TWO-PACK CURABLE COMPOSITION SET, THERMALLY CONDUCTIVE CURED PRODUCT, AND ELECTRONIC DEVICE

CROSS-REFERENCE TO RELATED APPLICATIONS

This application is the U.S. National Stage of PCT/JP2019/040087, filed Oct. 10, 2019, which claims priority to JP 2018-194637, filed Oct. 15, 2018.

TECHNICAL FIELD

The present invention relates to a two-pack curable composition set, a thermally conductive cured product, and an electronic device.

BACKGROUND ART

With the miniaturization and higher output of a heat generating electronic component such as a CPU (central processing unit) of a personal computer, the amount of heat generated per unit area from the electronic component has become very large. The amount of heat thereof reaches about 20 times that of an iron. In order to prevent the heat generating electronic component from failing for a long period of time, it is necessary to cool the heat generating electronic component. A metal heat sink or housing is used for cooling, and when the heat generating electronic component and the heat sink or the like are contacted with each other as they are, air is microscopically present at the interface thereof and may be an obstacle to thermal conduction. Therefore, heat is efficiently transferred by interposing a thermally conductive material between the heat generating electronic component and the heat sink or the like.

As the thermally conductive material, a fluid grease in which a liquid silicone is filled with a thermally conductive powder is particularly preferably used because it particularly easily conducts heat. As the grease, a grease obtained by containing a thermally conductive powder in a base oil which is a liquid silicone such as silicone oil or a low viscosity silicone such as a low molecular weight silicone are known (for example, Patent Literatures 1 to 4).

CITATION LIST

Patent Literature

Patent Literature 1: Japanese Patent Laid-Open No. 2009-286855
Patent Literature 2: Japanese Patent Laid-Open No. 2015-140395
Patent Literature 3: Japanese Patent Laid-Open No. 2014-105283
Patent Literature 4: Japanese Patent Laid-Open No. 2010-150399

SUMMARY OF INVENTION

Technical Problem

The lower the viscosity of a grease, the better from the viewpoint of coating performance, but when a grease having a low viscosity is used, the grease drops down in an application involving vertical use, and as a result, heat may not be able to be sufficiently removed. In addition, when a grease is mounted on an electronic component, the reliability as a thermally conductive material may be lowered because a gap is created because the grease cannot conform to the warp generated between the heat generating component and the cooling housing due to vibration or the like.

The present invention has been made in view of such circumstances, and an object thereof is to provide a two-pack curable composition set that can suppress dropping down even in an application involving vertical use, and can suppress a decrease in reliability due to vibration or the like when mounted on an electronic component, a thermally conductive cured product obtained from the two-pack curable composition set, and an electronic device comprising the thermally conductive cured product.

Solution to Problem

The present invention provides a two-pack curable composition set comprising a first agent and a second agent. The first agent contains an organopolysiloxane having a branched structure and having a vinyl group at least at an end or in a side chain, a thermally conductive filler, a silica powder, and a platinum catalyst, and has a viscosity at 25° C. at a shear rate of 10 $s^{-1}$ of 20 to 150 Pa·s. The second agent contains an organopolysiloxane having a branched structure and having a vinyl group at least at an end or in a side chain and a polydimethylsiloxane having a hydrosilyl group at least at an end or in a side chain, a thermally conductive filler, and a silica powder, and has a viscosity at 25° C. at a shear rate of 10 $s^{-1}$ of 20 to 150 Pa·s.

The content of the thermally conductive filler in the first agent may be 400 to 1000 parts by mass based on a content of the organopolysiloxane in the first agent of 100 parts by mass, and the content of the silica powder in the first agent may be 0.2 to 2.0 parts by mass based on a content of the organopolysiloxane in the first agent of 100 parts by mass.

The content of the thermally conductive filler in the second agent may be 400 to 1000 parts by mass based on a total content of the organopolysiloxane and the polydimethylsiloxane in the second agent of 100 parts by mass, and the content of the silica powder in the second agent may be 0.2 to 2.0 parts by mass based on a total content of the organopolysiloxane and the polydimethylsiloxane in the second agent of 100 parts by mass.

The present invention also provides a thermally conductive cured product obtained from a mixture of the first agent and the second agent in the two-pack curable composition set according to the present invention described above, and having a thermal conductivity of 1.0 to 3.0 W/mK.

The present invention further provides an electronic device comprising an electronic component, the thermally conductive cured product according to the present invention, and a housing for accommodating the electronic component and the thermally conductive cured product, wherein the electronic component and the housing are in contact with each other via the thermally conductive cured product.

Advantageous Effects of Invention

According to the present invention, it is possible to provide a two-pack curable composition set that can suppress dropping down even in an application involving vertical use, and can suppress a decrease in reliability due to vibration or the like when mounted on an electronic component, a thermally conductive cured product obtained from the two-pack curable composition set, and an electronic device comprising the thermally conductive cured product.

DESCRIPTION OF EMBODIMENTS

Figure 1:
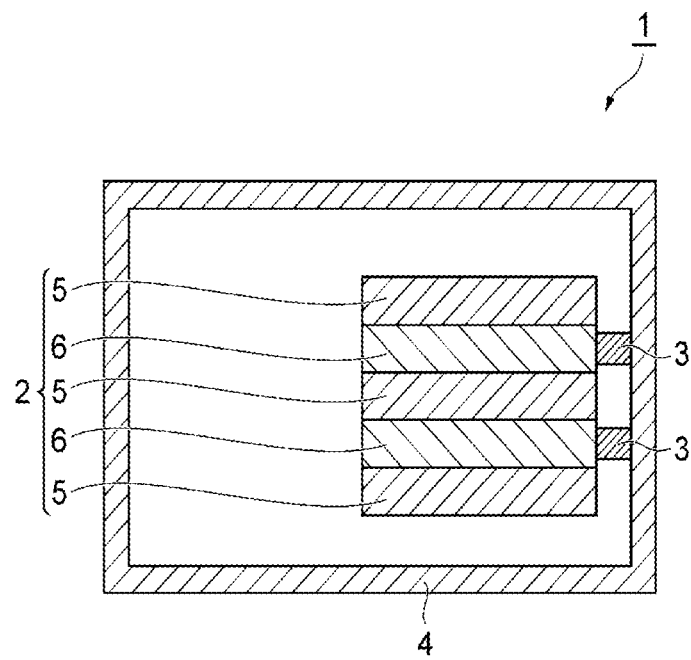
FIG. 1 shows a schematic cross-sectional view showing an embodiment of an electronic device.

Hereinafter, embodiments of the present invention will be described in detail. However, the present invention is not limited to the following embodiments.

[Two-Pack Curable Composition Set]

The two-pack curable composition set according to the present embodiment comprises a first agent and a second agent. Hereinafter, each component contained in the first agent and the second agent will be described.

<First Agent>

The first agent contains a specific organopolysiloxane (component A1), a thermally conductive filler (component A2), a silica powder (component A3), and a platinum catalyst (component A4).

(Component A1: Organopolysiloxane)

The organopolysiloxane of the present embodiment has a vinyl group at an end or in a side chain. In general, an organopolysiloxane having a vinyl group is one in which at least a part of R of the Si—R moiety (where R is a substituted or unsubstituted monovalent hydrocarbon group) in an organopolysiloxane molecule is a vinyl group. Such an organopolysiloxane may have a structural unit represented by the following general formula (a1-1) or an end structure represented by general formula (a1-2). The organopolysiloxane may have, for example, a structural unit represented by general formula (a1-1) and a structural unit represented by general formula (a1-3), or may have an end structure represented by general formula (a1-2) and a structural unit represented by general formula (a1-3). However, the organopolysiloxane of the present embodiment is not limited to those having these structural units or end structure, and may have, for example, two or more vinyl groups at an end or in a side chain.

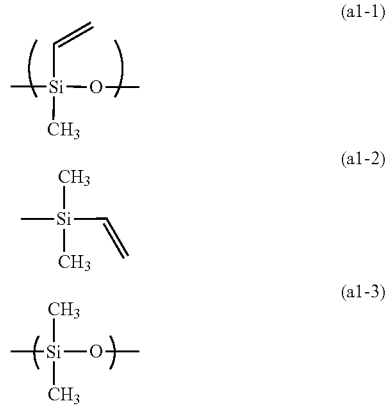

The content of the vinyl group in the organopolysiloxane is preferably 0.01 to 15 mol %, and more preferably 0.01 to 5 mol %. The "content of the vinyl group" in the present invention means the mol % of the vinyl group-containing siloxane structural unit when all structural units constituting the organopolysiloxane are 100 mol %. However, the content of the vinyl group is a value assuming that there is one vinyl group for one vinyl group-containing siloxane structural unit.

The content of the vinyl group is measured by the following method.

The vinyl group content is measured by NMR. Specifically, for example, ECP-300NMR manufactured by JEOL Ltd. is used to dissolve an organopolysiloxane having a vinyl group in deuterated chloroform as a deuterated solvent and carry out measurement. The proportion of the vinyl group when (vinyl group+hydrosilyl group+Si-methyl group) is 100 mol % is defined as the vinyl group content mol %.

Examples of a substituted or unsubstituted monovalent hydrocarbon group other than the vinyl group include an alkyl group such as a methyl group, an ethyl group, a propyl group, a butyl group, a pentyl group, a hexyl group, a heptyl group, an octyl group, a nonyl group, a decyl group, or a dodecyl group; a cycloalkyl group such as a cyclopentyl group or a cyclohexyl group; an aryl group such as a phenyl group, a tolyl group, a xylyl group, or a naphthyl group; an aralkyl group such as a benzyl group, a 2-phenylethyl group, or a 2-phenylpropyl group; an alkyl halide group such as a chloromethyl group, a 3,3,3-trifluoropropyl group, or a 3-chloropropyl group. From the viewpoint of synthesis and economic efficiency, 90% or more thereof are preferably methyl groups, and the organopolysiloxane of the present embodiment is more preferably a polydimethylsiloxane having a vinyl group.

The organopolysiloxane of the present embodiment has a branched structure. By having a branched structure, the viscosity is low before curing, the viscosity does not become too high even when the organopolysiloxane is filled with a thermally conductive filler, and the coatability is excellent, and after curing, high shear displacement and elongation at break can be achieved.

Whether or not the organopolysiloxane has a branched structure can be determined by examining the presence or absence of a peak at −55 to −66 ppm or −100 to −110 ppm, which is a chemical shift derived from the branched structure, by $^{29}$Si-NMR measurement using "nuclear magnetic resonance apparatus AVANCE III-500" (trade name) manufactured by Bruker Corporation.

The viscosity of the organopolysiloxane of the present embodiment at 25° C. is preferably 100 to 1000 mPa·s. When the viscosity of the organopolysiloxane at 25° C. is 100 mPa·s or more, sufficient shear displacement and elongation at break can be ensured in the cured product described later, and a decrease in reliability against vibration and the like can be suppressed when mounted on an electronic component. In addition, when the viscosity of the organopolysiloxane at 25° C. is 1000 mPa·s or less, the viscosity does not become too high when the organopolysiloxane is filled with a thermally conductive filler, and the coatability and the adhesion to a heat generating component can be kept good. From these viewpoints, the viscosity of the organopolysiloxane at 25° C. is preferably 200 to 800 mPa·s, and more preferably 300 to 700 mPa·s.

The viscosity of the organopolysiloxane at 25° C. can be measured using a digital viscometer "DV-1" manufactured by AMETEK Brookfield. Using an RV spindle set, using rotor No. 1, and using a container that can contain the rotor and the organopolysiloxane up to the reference line, the rotor is immersed in the organopolysiloxane to measure the viscosity at 25° C. at a rotation speed of 10 rpm.

(Component A2: Thermally Conductive Filler)

The thermally conductive filler is, for example, a filler having a thermal conductivity of 10 W/m·K or more. Examples of the thermally conductive filler include aluminum oxide (hereinafter, also referred to as "alumina"), aluminum nitride, boron nitride, silicon nitride, zinc oxide, aluminum hydroxide, metallic aluminum, magnesium oxide, copper, and silver. These can be used singly or in combinations of two or more. Alumina is preferable from the viewpoint of filling properties and thermal conductivity. As used herein, the "thermally conductive filler" does not include any silica powder described later.

The thermally conductive filler preferably has an average particle diameter of 1 to 50 μm, and a thermally conductive filler (A2-1) having an average particle diameter of 40 to 50 μm, and a thermally conductive filler (A2-2) having an average particle diameter of 1 to 10 μm are more preferably used in combination. In this case, the blending proportion of A2-1 and A2-2 (A2-1:A2-2) is not particularly limited, and may be, for example, 8:2 to 4:6 in terms of mass ratio. The particle size distribution of the thermally conductive filler can be prepared by classification and mixing operations of the thermally conductive filler. The average particle diameter in the present embodiment shall mean D50 (median diameter).

The content of the thermally conductive filler is preferably 400 to 1000 parts by mass, more preferably 470 to 930 parts by mass, and further preferably 550 to 850 parts by mass based on a content of the above component A1 of 100 parts by mass. If the content of the thermally conductive filler is 400 parts by mass or more based on a content of the above component A1 of 100 parts by mass, the thermal conductivity of the obtained cured product is better, and if the content is 1000 parts by mass or less, a decrease in fluidity can be suppressed more effectively, the coatability can be ensured, and a decrease in shear displacement of the cured product can be further effectively suppressed.

(Component A3: Silica Powder)

The silica powder is a component for effectively suppressing dropping down when after coating with a mixture obtained by mixing the first agent and the second agent according to the present embodiment, the coated surface is made vertical. Examples of the silica powder include a silica powder such as fumed silica and precipitated silica. The surface of the silica powder may be untreated or may be hydrophobized with an organic silicon compound such as alkoxysilane, chlorosilane, or silazane, but a surface-untreated silica powder is preferably used from the viewpoint of effectively suppressing an increase in viscosity. The specific surface area of the silica powder may be, for example, 90 to 360 m²/g.

The content of the silica powder is preferably 0.2 to 2.0 parts by mass, more preferably 0.25 to 1.5 parts by mass, and further preferably 0.4 to 1.2 parts by mass based on a content of the above component A1 of 100 parts by mass. If the content of the silica powder is 0.2 parts by mass or more based on a content of the above A1 component of 100 parts by mass, the dropping down when the coated surface is made vertical after coating with the obtained mixture can be effectively suppressed, and if the content is 2.0 parts by mass or less, an increase in viscosity and a decrease in fluidity of the obtained mixture can be effectively suppressed, the coatability can be improved, and a decrease in shear displacement and breaking elongation of the cured product can be further effectively suppressed.

(Component A4: Platinum Catalyst)

The platinum catalyst is a component that promotes the addition reaction between a vinyl group in the above component A1 and a hydrosilyl group in component B2 described later. The platinum catalyst may be elemental platinum or a platinum compound. Examples of the platinum compound include chloroplatinic acid, a platinum-olefin complex, a platinum-alcohol complex, and a platinum coordination compound.

The content of the platinum catalyst is preferably 0.1 to 500 ppm based on a content of the above component A1 of 100 parts by mass. If the content of the platinum catalyst is within the above range, the effect as a catalyst can be sufficiently obtained.

The first agent according to the present embodiment may further contain an additive such as an organosilane or a colorant, if necessary, in addition to the above components A1 to A4.

The organosilane is an additive for improving the wettability of the above thermally conductive filler and the organopolysiloxane, and the organosilane represented by the following general formula (a5) is preferably used.

$$R^1_a R^2_b Si(OR^3)_{4-(a+b)} \quad (a5)$$

In the formula (a5), $R^1$ is an alkyl group having 1 to 15 carbon atoms, and examples thereof include a methyl group, an ethyl group, a propyl group, a hexyl group, a nonyl group, a decyl group, a dodecyl group, and a tetradecyl group. $R^1$ is preferably an alkyl group having 6 to 12 carbon atoms. $R^2$ is a saturated or unsaturated monovalent hydrocarbon group having 1 to 8 carbon atoms, and examples thereof include a cycloalkyl group such as a cyclopentyl group or a cyclohexyl group, an alkenyl group such as a vinyl group or an allyl group, an aryl group such as a phenyl group or a tolyl group, an aralkyl group such as a 2-phenylethyl group or a 2-methyl-2-phenylethyl group, and a halogenated hydrocarbon group such as a 3,3,3-trifluoropropyl group, a 2-(perfluorobutyl)ethyl group, a 2-(perfluorooctyl)ethyl group, and a p-chlorophenyl group. $R^3$ is one or more alkyl groups having 1 to 6 carbon atoms such as a methyl group, an ethyl group, a propyl group, a butyl group, a pentyl group, and a hexyl group, and is preferably a methyl group or an ethyl group. a is an integer of 1 to 3, and is preferably 1. b is an integer of 0 to 2, and is preferably 0. a+b is an integer of 1 to 3, and is preferably 1.

The content of the organosilane is preferably 0.01 to 30 parts by mass, and more preferably 0.1 to 5.0 parts by mass based on a content of the above component A1 of 100 parts by mass. If the content of the organosilane is within the above range, the wettability can be effectively improved.

The content of the colorant is not particularly limited, and is, for example, 0.05 to 0.2 parts by mass per 100 parts by mass in total of the first agent and the second agent described later.

The viscosity of the first agent according to the present embodiment at 25° C. at a shear rate of 10 s⁻¹ is 20 to 150 Pa·s, and preferably 50 to 120 Pa·s. If the viscosity is 20 Pa·s or more, dropping down can be suppressed even in an application involving vertical use, and if the viscosity is 150 Pa·s or less, the fluidity when the first agent and the second agent described later are mixed and when coating with the mixture is carried out can be ensured.

The viscosity of the first agent at 25° C. at a shear rate of 10 s⁻¹ can be measured using a rotary rheometer "HANKE-MARS III" manufactured by Thermo Fisher Scientific Inc. More specifically, the viscosity can be measured using a parallel plate having a diameter of 35 mmφ under conditions of a gap of 0.5 mm, a temperature of 25° C., and a shear rate of 10 s$^{-1}$.

<Second Agent>

The second agent contains a specific organopolysiloxane (component B1), a thermally conductive filler (component B2), a silica powder (component B3), and a specific polydimethylsiloxane (component B4).

(Component B1: Organopolysiloxane)

The organopolysiloxane as component B1 is the same as the organopolysiloxane as component A1 described above, and redundant description will be omitted here. The organopolysiloxane as component B1 and the organopolysiloxane as component A1 may be the same or different.

(Component B2: Thermally Conductive Filler)

The thermally conductive filler as component B2 is the same as the thermally conductive filler as component A2 described above, and redundant description will be omitted here. The thermally conductive filler as component B2 and the thermally conductive filler as component A2 may be the same or different.

The content of the thermally conductive filler is preferably 400 to 1000 parts by mass, more preferably 470 to 930 parts by mass, and further preferably 550 to 850 parts by mass per 100 parts by mass in total of the above component B1 and component B4 described later. If the content of the thermally conductive filler is 400 parts by mass or more per 100 parts by mass in total of component B1 and component B4, the thermal conductivity of the obtained cured product is better, and if the content is 1000 parts by mass or less, a decrease in fluidity can be suppressed more effectively, the coatability can be ensured, and a decrease in shear displacement of the cured product can be further effectively suppressed.

(Component B3: Silica Powder)

The silica powder as component B3 is the same as the silica powder as component A3 described above, and redundant description will be omitted here. The silica powder as component B3 and the silica powder as component A3 may be the same or different.

The content of the silica powder is preferably 0.2 to 2.0 parts by mass, more preferably 0.25 to 1.5 parts by mass, and further preferably 0.4 to 1.2 parts by mass per 100 parts by mass in total of the above component B1 and component B4 described later. If the content of the silica powder is 0.2 parts by mass or more per 100 parts by mass in total of component B1 and component B4, the dropping down when the coated surface is made vertical after coating with the obtained mixture can be effectively suppressed, and if the content is 2.0 parts by mass or less, an increase in viscosity and a decrease in fluidity of the obtained mixture can be effectively suppressed, the coatability can be improved, and a decrease in shear displacement and breaking elongation of the cured product can be further effectively suppressed.

(Component B4: Polydimethylsiloxane)

The polydimethylsiloxane according to the present embodiment has a hydrosilyl group (H—Si group) at least at an end or in a side chain. The hydrosilyl group reacts with the vinyl group in component A1 and component B1 by the action of component A4 in the first agent described above to give a crosslinked cured product having a three-dimensional network structure having a crosslinkage. In general, a polydimethylsiloxane having a hydrosilyl group is one in which a part of R of the Si—R moiety in a molecule of the polydimethylsiloxane is a hydrogen atom. Such a polydimethylsiloxane may have a structural unit represented by the following general formula (b4-1) or an end structure represented by general formula (b4-2). The polydimethylsiloxane may have, for example, a structural unit represented by general formula (b4-1) and a structural unit represented by general formula (b4-3), or may have an end structure represented by general formula (b4-2) and a structural unit represented by general formula (b4-3). However, the polydimethylsiloxane of the present embodiment is not limited to those having these structural units or end structure, and may have, for example, two or more or three or more hydrosilyl groups at an end or in a side chain.

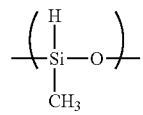
(b4-1)

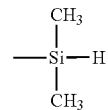
(b4-2)

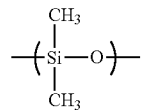
(b4-3)

The content of the hydrosilyl group in the polydimethylsiloxane is preferably 0.01 to 15 mol %, and more preferably 0.01 to 10 mol %. The "content of the hydrosilyl group" in the present invention means the mol % of the hydrosilyl group-containing siloxane structural unit when all structural units constituting the polydimethylsiloxane are 100 mol %. However, the content of the hydrosilyl group is a value assuming that there is one hydrosilyl group for one hydrosilyl group-containing siloxane structural unit.

The content of the hydrosilyl group is measured by the following method.

The hydrosilyl group content is measured by NMR. Specifically, ECP-300NMR manufactured by JEOL Ltd. is used to dissolve a polydimethylsiloxane having a hydrosilyl group in deuterated chloroform as a deuterated solvent and carry out measurement. The proportion of the hydrosilyl group when (vinyl group+hydrosilyl group+Si-methyl group) is 100 mol % is defined as the hydrosilyl group content mol %.

The polydimethylsiloxane of the present embodiment may have either a linear structure or a branched structure, and preferably has a branched structure. By using a polydimethylsiloxane having a branched structure, the viscosity is low before curing, the viscosity does not become too high even when the polydimethylsiloxane is filled with a thermally conductive filler, and the coatability is excellent, and after curing, high shear displacement and elongation at break can be achieved.

Whether or not the polydimethylsiloxane has a branched structure can be determined by examining the presence or absence of a peak at −55 to −66 ppm or −100 to −110 ppm, which is a chemical shift derived from the branched structure, by $^{29}$Si-NMR measurement using "nuclear magnetic resonance apparatus AVANCE III-500" (trade name) manufactured by Bruker Corporation.

The viscosity of the polydimethylsiloxane of the present embodiment at 25° C. is preferably 10 to 1000 mPa·s. When the viscosity of the polydimethylsiloxane at 25° C. is 10 mPa·s or more, sufficient shear displacement and elongation at break can be ensured in the cured product described later, and the reliability against vibration and the like can be suppressed when mounted on an electronic component is more effectively improved. In addition, when the viscosity of the polydimethylsiloxane at 25° C. is 1000 mPa·s or less, the viscosity does not become too high when the polydimethylsiloxane is filled with a thermally conductive filler, and the coatability and adhesion to a heat generating component can be sufficiently ensured. From these viewpoints, the viscosity of the polydimethylsiloxane at 25° C. is more preferably 20 to 500 mPa·s, and further preferably 20 to 300 mPa·s.

The viscosity of the polydimethylsiloxane at 25° C. can be measured using a digital viscometer "DV-1" manufactured by AMETEK Brookfield. Using an RV spindle set, using rotor No. 1, and using a container that can contain the rotor and the polydimethylsiloxane up to the reference line, the rotor is immersed in the polydimethylsiloxane to measure the viscosity at 25° C. and a rotation speed of 10 rpm.

The content proportion of the polydimethylsiloxane and component B1 in the second agent may be appropriately set according to the content of the vinyl group in component B1 and the content of the hydrosilyl group in component B4, and for example, the content of the vinyl group/the content of the hydrosilyl group=50/1 to 1/1.2. If the content of the vinyl group and the content of the hydrosilyl group are within the above ranges, the crosslinked structure required for gelation can be sufficiently formed, and the heat resistance of the cured product can be ensured.

The second agent according to the present embodiment may further contain an additive such as an organosilane or a colorant, if necessary, in addition to the above components B1 to B4.

The viscosity of the second agent according to the present embodiment at 25° C. at a shear rate of 10 $s^{-1}$ is 20 to 150 Pa·s, and preferably 50 to 120 Pa·s. If the viscosity is 20 Pa·s or more, dropping down can be suppressed even in an application involving vertical use, and if the viscosity is 150 Pa·s or less, the fluidity when the first agent and the second agent are mixed and when coating with the mixture is carried out can be ensured.

The viscosity of the second agent at 25° C. at a shear rate of 10 $s^{-1}$ can be measured using a rotary rheometer "HANKEMARS III" manufactured by Thermo Fisher Scientific Inc. More specifically, the viscosity can be measured using a parallel plate having a diameter of 35 mmφ under conditions of a gap of 0.5 mm, a temperature of 25° C., and a shear rate of 10 $s^{-1}$.

[Thermally Conductive Cured Product]

The thermally conductive cured product according to the present embodiment can be obtained, for example, by mixing the first agent and the second agent in the above-described two-pack curable composition set. More specifically, the thermally conductive cured product (crosslinked cured product) is obtained by, in a mixture obtained by mixing the first agent and the second agent, allowing the action of the A4 component contained in the first agent to cause the addition reaction between the vinyl group in component A1 contained in the first agent and component B1 contained in the second agent and the hydrosilyl group in component B4 contained in the second agent to proceed to form a three-dimensional network structure having a crosslinkage. The thermally conductive cured product may be shaped into a desired shape after the mixing as described above.

For mixing, for example, a mixing machine such as a roll mill, a kneader, or a Banbury mixer is used, and examples of a mixing method include a method of kneading using a universal mixing stirrer, a hybrid mixer, and Tri-Mix (manufactured by INOUE MFG., INC.). A doctor blade method is preferable as the shaping method, but an extrusion method, a press method, a calendar roll method, or the like can be used depending on the viscosity of a resin. The reaction conditions in the progress of the addition reaction are not particularly limited, and the addition reaction is usually at room temperature (for example, 25° C.) to 150° C. for 0.1 to 24 hours.

The mixing proportion of the first agent and the second agent can be appropriately set according to the types of the first agent and the second agent used and the intended use, and for example, the volume ratio of the first agent:the second agent may be 1.5:1.0 to 1.0:1.5, and may be 1:1.

The thermally conductive cured product has high thermal conductivity, and has, for example, a thermal conductivity of 1.0 W/mK or more, or 1.5 W/mK or more. The upper limit of the thermal conductivity of the thermally conductive cured product is not particularly limited, and may be, for example, 3.0 W/mK or less.

[Electronic Device]

FIG. 1 is a schematic cross-sectional view showing an embodiment of an electronic device. As shown in FIG. 1, the electronic device 1 according to the present embodiment includes an electronic component 2, the thermally conductive cured product 3 according to the present embodiment described above, and a housing 4 for accommodating an electronic component 2 and the thermally conductive cured product 3, and in the electronic device 1, the electronic component 2 and the housing 4 are in contact with each other via the thermally conductive cured product 3.

The electronic component 2 may be an LSI (large-scale integrated circuit), an IC (integrated circuit), a semiconductor package, or the like, and for example, may have a structure in which battery cells 5 and electrically conductive layers 6 are alternately stacked, as shown in FIG. 1. The electrically conductive layers 6 may be formed of a metal foil or a metal mesh. As a metal constituting the metal foil or the metal mesh, for example, at least one selected from the group consisting of aluminum, copper, silver, and gold is contained. The metal foil may be an aluminum foil, a copper foil, a silver foil or a gold foil, and the aluminum foil is preferable from the viewpoint of obtaining a suitable specific gravity.

The housing 4 is, for example, a box having a hollow rectangular parallelepiped shape. The housing 4 may be made of a metal such as a GA steel sheet or made of a resin.

The electronic component 2 and the housing 4 are connected via the thermally conductive cured product 3. As shown in FIG. 1, when the electronic component 2 has a structure in which the battery cells 5 and the conductive layers 6 are alternately stacked, the electrically conductive layers 6 and the housing 4 in the electronic component 2 may be connected via the thermally conductive cured product 3. Thereby, the heat generated by the electronic component 2 can be released to the outside via the housing 4.

In the electronic device 1 according to the present embodiment, the thermally conductive cured product 3 may be disposed in such a way as to contact on the inner wall surface 4a of the housing 4. The thermally conductive cured product 3 is obtained from the two-pack curable composition set according to the present embodiment described above, and thus dropping down can be suppressed even in an application involving vertical use.

The thickness of the thermally conductive cured product 3 is not particularly limited, and may be, for example, 0.2 mm or more from the viewpoint of shear displacement, and may be, for example, 3.0 mm or less from the viewpoint of heat dissipation.

EXAMPLES

Hereinafter, the present invention will be described in more detail with reference to Examples, but the present invention is not limited to the following Examples.

[First Agent]

Components A1 to A4 shown below were mixed based on the blending ratio (parts by mass) shown in Table 1 to prepare first agents a1 to a10.

<Component A1: Organopolysiloxane>
A1-1: Polydimethylsiloxane having a branched structure and having a vinyl group, viscosity at 25° C.: 50 mPa·s, vinyl group content: 5.0 mol %
A1-2: Polydimethylsiloxane having a branched structure and having a vinyl group, viscosity at 25° C.: 120 mPa·s, vinyl group content: 2.5 mol %
A1-3: Polydimethylsiloxane having a branched structure and having a vinyl group, viscosity at 25° C.: 500 mPa·s, vinyl group content: 1.1 mol %
A1-4: Polydimethylsiloxane having a branched structure and having a vinyl group, viscosity at 25° C.: 900 mPa·s, vinyl group content: 0.9 mol %
A1-5: Polydimethylsiloxane having a branched structure and having a vinyl group, viscosity at 25° C.: 1200 mPa·s, vinyl group content: 0.8 mol %
A1-6: Polydimethylsiloxane having no branched structure and having a vinyl group, viscosity at 25° C.: 500 mPa·s, vinyl group content: 1.1 mol %

<Component A2: Thermally Conductive Filler>
A2-1: Spherical alumina, average particle size: 45 μm, DAW45S (manufactured by Denka Company Limited, trade name)
A2-2: Spherical alumina, average particle size: 5 μm, DAW05 (manufactured by Denka Company Limited, trade name)

<Component A3: Silica Powder>
A3: Specific surface area: 200 m²/g, AEROSIL 200 (manufactured by NIPPON AEROSIL CO., LTD., trade name)

<Component A4: Platinum Catalyst>
A4: Platinum complex polymethyl vinylsiloxane solution (manufactured by Bluestar Silicones, trade name: Silcolease Catalyst 12070)

TABLE 1

|    |      | a1 | a2 | a3 | a4 | a5 | a6 | a7 | a8 | a9 | a10 |
|----|------|----|----|----|----|----|----|----|----|----|-----|
| A1 | A1-1 | — | — | — | — | — | — | — | 100 | — | — |
|    | A1-2 | 100 | — | — | — | — | — | — | — | — | — |
|    | A1-3 | — | 100 | — | 100 | 100 | 100 | 100 | — | — | — |
|    | A1-4 | — | — | 100 | — | — | — | — | — | — | — |
|    | A1-5 | — | — | — | — | — | — | — | — | 100 | — |
|    | A1-6 | — | — | — | — | — | — | — | — | — | 100 |
| A2 | A2-1 | 414 | 414 | 414 | 280 | 560 | 414 | 414 | 414 | 414 | 414 |
|    | A2-2 | 276 | 276 | 276 | 190 | 370 | 276 | 276 | 276 | 276 | 276 |
| A3 |      | 0.75 | 0.75 | 0.75 | 0.75 | 0.75 | 0.25 | 1.5 | 0.75 | 0.75 | 0.75 |
| A4 |      | q.s. | q.s. | q.s. | q.s. | q.s. | q.s. | q.s. | q.s. | q.s. | q.s. |
| Viscosity (Pa·s) | | 30 | 60 | 140 | 35 | 130 | 55 | 70 | 20 | 300 | 140 | q.s.: quantum sufficit

[Second Agent]
Components B1 to B4 shown below were mixed based on the blending ratio (parts by mass) shown in Table 2 to prepare second agents b1 to b10.
<Component B1: Organopolysiloxane>
B1-1: Polydimethylsiloxane having a branched structure and having a vinyl group, viscosity at 25° C.: 50 mPa·s, vinyl group content: 5.0 mol %
B1-2: Polydimethylsiloxane having a branched structure and having a vinyl group, viscosity at 25° C.: 120 mPa·s, vinyl group content: 2.5 mol %
B1-3: Polydimethylsiloxane having a branched structure and having a vinyl group, viscosity at 25° C.: 500 mPa·s, vinyl group content: 1.1 mol %
B1-4: Polydimethylsiloxane having a branched structure and having a vinyl group, viscosity at 25° C.: 900 mPa·s, vinyl group content: 0.9 mol %
B1-5: Polydimethylsiloxane having a branched structure and having a vinyl group, viscosity at 25° C.: 1200 mPa·s, vinyl group content: 0.8 mol %
B1-6: Polydimethylsiloxane having no branched structure and having a vinyl group, viscosity at 25° C.: 500 mPa·s, vinyl group content: 1.1 mol %
<Component B2: Thermally Conductive Filler>
B2-1: Spherical alumina, average particle size: 45 µm, DAW45S (manufactured by Denka Company Limited, trade name)
B2-2: Spherical alumina, average particle size: 5 µm, DAW05 (manufactured by Denka Company Limited, trade name)
<Component B3: Silica Powder>
B3: Specific surface area: 200 m$^2$/g, AEROSIL 200 (manufactured by NIPPON AEROSIL CO., LTD., trade name)
<Component B4: Polydimethylsiloxane>
B4: Polydimethylsiloxane having a hydrosilyl group, viscosity at 25° C.: 30 mPa·s Whether or not the above component A1, component B1, and component B4 have a branched structure was determined by examining the presence or absence of a peak at −55 to −66 ppm or −100 to −110 ppm, which is a chemical shift derived from the branched structure, by $^{29}$Si-NMR measurement using "nuclear magnetic resonance apparatus AVANCE III-500" (trade name) manufactured by Bruker Corporation.

The viscosity of the above component A1, component B1, and component B4 was measured using "Digital Viscometer DV-1" (trade name) manufactured by AMETEK Brookfield. Specifically, using an RV spindle set, using rotor No. 1, and using a container that can contain the rotor and an evaluation sample up to the reference line, the rotor was immersed in the evaluation sample to measure the viscosity at 25° C. and a rotation speed of 10 rpm.

The average particle size of the thermally conductive filler was measured using "Laser Diffraction Type Particle Size Distribution Analyzer SALD-20" (trade name) manufactured by Shimadzu Corporation. For the evaluation sample, 50 ml of pure water and 5 g of the thermally conductive filler powder measured were added to a glass beaker, stirred using a spatula, and then subjected to dispersion treatment using an ultrasonic cleaner for 10 minutes. A solution of the thermally conductive filler powder subjected to the dispersion treatment was added drop by drop to the sampler section of the analyzer using a dropper, and the measurement was carried out when the absorbance became stable. In the laser diffraction type particle size distribution analyzer, the particle size distribution was calculated from data on the light intensity distribution of the diffraction/scattering holes by the particles detected by a sensor. The average particle size was obtained by multiplying the measured particle size value by the relative amount of particles (difference %) and dividing it by the total relative amount of particles (100%). The average particle size is the average diameter of the particles, and can be determined as the cumulative weight average value D50 (median diameter). D50 is the particle size at which the frequency of occurrence is the maximum.

The viscosity of the first agent and the second agent at 25° C. at a shear rate of 10 s$^{-1}$ was measured using a rotary rheometer "HANKEMARS III" manufactured by Thermo Fisher Scientific Inc. Specifically, the viscosity can be measured using a parallel plate having a diameter of 35 mmφ under conditions of a gap of 0.5 mm, a temperature of 25° C., and a shear rate of 10 s$^{-1}$.

[Thermally Conductive Cured Product]
The first agent and the second agent obtained above were used in the combinations shown in Tables 3 and 4, and mixed at a volume ratio of 1:1 to obtain a mixture. The obtained mixture was kept at 25° C. for 24 hours to cause the curing reaction to proceed to obtain a thermally conductive

TABLE 2

| | | b1 | b2 | b3 | b4 | b5 | b6 | b7 | b8 | b9 | b10 |
|---|---|---|---|---|---|---|---|---|---|---|---|
| B1 | B1-1 | — | — | — | — | — | — | — | 90 | — | — |
| | B1-2 | 90 | — | — | — | — | — | — | — | — | — |
| | B1-3 | — | 90 | — | 90 | 90 | 90 | 90 | — | — | — |
| | B1-4 | — | — | 90 | — | — | — | — | — | — | — |
| | B1-5 | — | — | — | — | — | — | — | — | 90 | — |
| | B1-6 | — | — | — | — | — | — | — | — | — | 90 |
| B2 | B2-1 | 414 | 414 | 414 | 280 | 560 | 414 | 414 | 414 | 414 | 414 |
| | B2-2 | 276 | 276 | 276 | 190 | 370 | 276 | 276 | 276 | 276 | 276 |
| B3 | | 0.75 | 0.75 | 0.75 | 0.75 | 0.75 | 0.25 | 1.5 | 0.75 | 0.75 | 0.75 |
| B4 | | 10 | 10 | 10 | 10 | 10 | 10 | 10 | 10 | 10 | 10 |
| Viscosity (Pa·s) | | 25 | 50 | 130 | 30 | 130 | 45 | 60 | 15 | 290 | 130 | cured product. Each evaluation of the thermally conductive cured product was carried out according to the following method. The evaluation results are summarized in Tables 3 and 4.
<Thermal Conductivity>
The thermal conductivity of the thermally conductive cured product was measured by a method according to ASTM D5470 using a resin material thermal resistance measuring instrument manufactured by Hitachi Technologies and Services, Ltd. Specifically, the mixture obtained by mixing the first agent and the second agent in a volume ratio of 1:1 was shaped into thicknesses of 0.2 mm, 0.5 mm and 1.0 mm, respectively, and each shaped product obtained was kept at 25° C. for 24 hours to cause the curing reaction to proceed to obtain a thermally conductive cured product. Each thermal resistance values of the obtained thermally conductive cured products were measured in a measurement area of 10 mm×10 mm. The slope of a straight line obtained with the thermal resistance value as the vertical axis and the thickness of the thermally conductive cured product as the horizontal axis was calculated and used as the thermal conductivity of the thermally conductive cured product.

<Dropping Down Properties>

Figure 2:
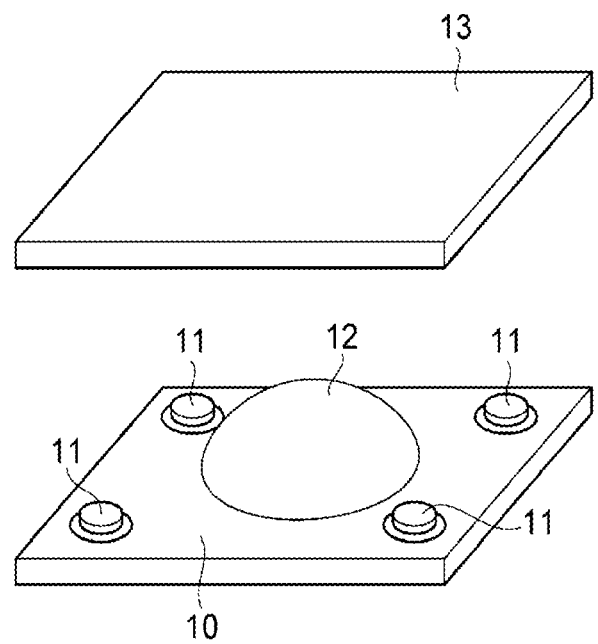
FIG. 2 shows a schematic diagram illustrating a test method for dropping down properties in an Example.
Figure 3:
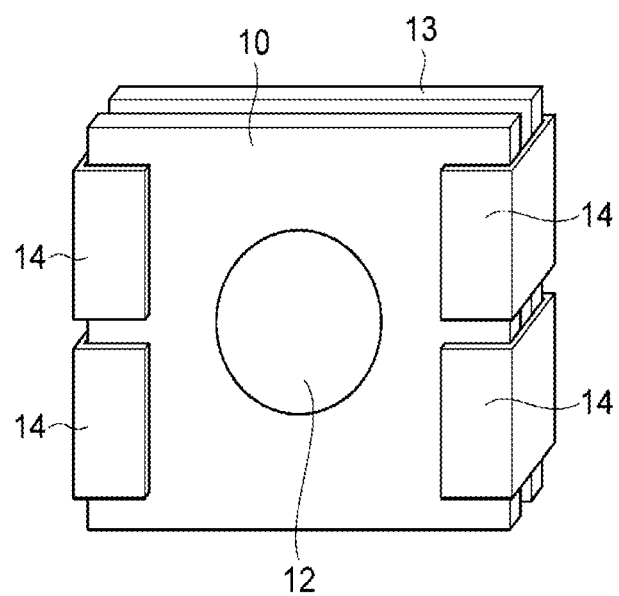
FIG. 3 shows a schematic diagram illustrating a test method for dropping down properties in an Example.

The dropping down properties of the thermally conductive cured products were evaluated by the test method shown in FIGS. 2 and 3. First, as shown in FIG. 2, shims 11 having a thickness of 2 mm were placed at the four corners of a glass plate 10 of 80 mm×80 mm, and a mixture 12 obtained by mixing the first agent and the second agent at a volume ratio of 1:1 was applied in a circular shape to a substantially central portion of the glass plate 10 and sandwiched between the glass plate 10 and a glass plate 13 of 80 mm×80 mm. The amount of the mixture 12 applied was such that the size of the circular shape of the mixture formed when sandwiched between the glass plates 10 and 13 was 25 mmφ. Subsequently, as shown in FIG. 3, the glass plates 10 and 13 were fixed using a clip 14 and allowed to stand vertically, and after they were allowed to stand at 25° C. for 24 hours, the displacement of the thermally conductive cured product from the initial position was observed to thereby evaluate the dropping down properties. The dropping down properties were evaluated based on the following criteria.

A: After 24 hours, the thermally conductive cured product did not drop down.

B: After 24 hours, the thermally conductive cured product dropped down.

<Shear Displacement>

The shear displacement of the thermally conductive cured products was measured according to JIS K6850. Specifically, a mixture obtained by mixing the first agent and the second agent in a volume ratio of 1:1 was sandwiched in such a way as to have 12.5 mm×25 mm×1.5 mmt between an aluminum plate of 25 mm×100 mm×1 mmt and a hot-dip galvanized steel sheet of 25 mm×100 mm×0.5 mmt and allowed to stand at 25° C. for 24 hours for curing. After that, a test was carried out at a tensile speed of 50 mm/min using "Compact Table-Top tester EZ-LX" manufactured by Shimadzu Corporation, and the displacement (mm) at the maximum value of a load was read out as the shear displacement based on the relationship between the displacement and the load.

<Elongation at Break>

A mixture obtained by mixing the first agent and the second agent in a volume ratio of 1:1 was sandwiched between two PET films, shaped to a thickness of 1 mm through rolls, and then allowed to stand at 25° C. for 24 hours for curing. After curing, the cured product between the films was punched into a dumbbell No. 8 shape based on a method according to JIS K6251 and measured at a tensile speed of 50 mm/min, and the elongation rate (%) at the time of breaking was calculated.

TABLE 3

|  | Example 1 | Example 2 | Example 3 | Example 4 | Example 5 |
| --- | --- | --- | --- | --- | --- |
| First agent | a1 | a2 | a3 | a4 | a5 |
| Second agent | b1 | b2 | b3 | b4 | b5 |
| Thermal conductivity (W/mK) | 2 | 2 | 2 | 1.4 | 2.9 |
| Dropping down properties | A | A | A | A | A |
| Shear displacement (mm) | 1.0 | 1.3 | 1.8 | 2.1 | 1.0 |
| Elongation at break (%) | 160 | 200 | 230 | 250 | 100 |

TABLE 4

|  | Example 6 | Example 7 | Comparative Example 1 | Comparative Example 2 | Comparative Example 3 |
| --- | --- | --- | --- | --- | --- |
| First agent | a6 | a7 | a8 | a9 | a10 |
| Second agent | b6 | b7 | b8 | b9 | b10 |
| Thermal conductivity (W/mK) | 1.9 | 2.1 | 2 | 2 | 2 |
| Dropping down properties | A | A | B | *1 | A |
| Shear displacement (mm) | 1.6 | 1.3 | 0.7 | *1 | 0.5 |
| Elongation at break (%) | 220 | 160 | 80 | *1 | 70 |

*1: No cured product was formed and able to be evaluated.

REFERENCE SIGNS LIST

1 . . . electronic device, 2 . . . electronic components, 3 . . . thermally conductive cured product, 4 . . . housing, 5 . . . battery cell, 6 . . . electrically conductive layer, 10 . . . glass plate, 11 . . . shim, 12 . . . mixture, 13 . . . glass plate, 14 . . . clip.

The invention claimed is:

1. A two-pack curable composition set comprising:
a first agent comprising an organopolysiloxane having a branched structure and having a vinyl group at least at an end or in a side chain, a thermally conductive filler, a silica powder, and a platinum catalyst, and having a viscosity at 25° C. at a shear rate of 10 s$^{-1}$ of 20 to 150 Pa·s; and
a second agent comprising an organopolysiloxane having a branched structure and having a vinyl group at least at an end or in a side chain, and a polydimethylsiloxane having a hydrosilyl group at least at an end or in a side chain, a thermally conductive filler, and a silica powder, and having a viscosity at 25° C. at a shear rate of 10 s$^{-1}$ of 20 to 150 Pa·s.

2. The two-pack curable composition set according to claim 1, wherein
a content of the thermally conductive filler in the first agent is 400 to 1000 parts by mass based on a content of the organopolysiloxane in the first agent of 100 parts by mass, and
a content of the silica powder in the first agent is 0.2 to 2.0 parts by mass based on a content of the organopolysiloxane in the first agent of 100 parts by mass.

3. The two-pack curable composition set according to claim 1, wherein
a content of the thermally conductive filler in the second agent is 400 to 1000 parts by mass based on a total content of the organopolysiloxane and the polydimethylsiloxane in the second agent of 100 parts by mass, and
a content of the silica powder in the second agent is 0.2 to 2.0 parts by mass based on a total content of the organopolysiloxane and the polydimethylsiloxane in the second agent of 100 parts by mass.

4. A thermally conductive cured product obtained from a mixture of the first agent and the second agent in the two-component curable composition set according to claim 1, and having a thermal conductivity of 1.0 to 3.0 W/mK.

5. An electronic device comprising an electronic component, the thermally conductive cured product according to claim 4, and a housing for accommodating the electronic component and the thermally conductive cured product, wherein
the electronic component and the housing are in contact with each other via the thermally conductive cured product.

* * * * *